United States Patent [19]
Huang et al.

[11] Patent Number: 6,030,879
[45] Date of Patent: Feb. 29, 2000

[54] METHOD OF REDUCING PARTICLES DURING THE MANUFACTURING OF FIN OR CYLINDER CAPACITORS ON A WAFER

[75] Inventors: Yuan-Chang Huang, Miao Li Hsien; Yung-Kuan Hsiao, Hsinchu; Dah Jong Ou Yang, Taipei Hsien, all of Taiwan

[73] Assignee: Taiwan Semiconductor Manufacturing Co. Ltd., Hsinchu, Taiwan

[21] Appl. No.: 08/835,314

[22] Filed: Apr. 7, 1997

[51] Int. Cl.⁷ .................... H01L 21/20; H01L 21/8242
[52] U.S. Cl. .................... 438/397; 438/253; 438/254; 438/396
[58] Field of Search .................... 438/253, 396, 438/254, 255, 397, 398; 257/307, 308

[56] References Cited

U.S. PATENT DOCUMENTS 5,175,128  12/1992  Ema et al. .................... 438/254

*Primary Examiner*—Carl Whitehead, Jr.
*Assistant Examiner*—Toniae M. Thomas
*Attorney, Agent, or Firm*—Christensen O'Connor Johnson & Kindness PLLC

[57] ABSTRACT

The present invention is a method for reducing particles during the manufacturing of fin or cylinder capacitors on a wafer. This invention utilizes a negative photoresist wafer edge exposure process to protect the edge of a wafer. This prevents polysilicon peeling from the edge of the wafer so as to reduce the defects and particles appearing on the wafer.

8 Claims, 15 Drawing Sheets

METHOD OF REDUCING PARTICLES DURING THE MANUFACTURING OF FIN OR CYLINDER CAPACITORS ON A WAFER

FIELD OF THE INVENTION

The present invention relates to fin or cylinder capacitor manufacturing processes, and more particularly, to a method of reducing particles during the manufacturing of fin or cylinder capacitors on a wafer.

BACKGROUND OF THE INVENTION

One of the major issues for DRAM products is defect reduction. Scrubber cleaning is the standard approach for removing the defects. However, due to product sensitivity, scrubber cleaning cannot always be implemented during certain stages of manufacture, particularly after the relatively fragile fin or cylinder capacitor is formed. Therefore, it is difficult to reduce product defects during the manufacture of fin or cylinder capacitor DRAMs.

To understand the defect problem during the manufacture of fin or cylinder capacitor DRAM manufacturing, it is important to understand how a typical fin or cylinder capacitor DRAM is manufactured.

FIGS. 1–7 schematically illustrate cross-sectional views of the structure formed at various stages in the fabrication of a fin capacitor using conventional processes. Referring to FIG. 1, a single crystal substrate 10 with a <100> crystallographic orientation is provided. In this embodiment adapted for DRAM fabrication, metal-oxide-semiconductor field effect transistors (MOSFETs), word lines and bit lines are formed in and on the substrate 10 in any suitable manner. In one embodiment, the word lines and bit lines are formed as follows.

A thick field oxide (FOX) region 12 is formed to provide isolation between devices on the substrate 10. Next, a silicon dioxide layer 14 is created on the top of surface of the substrate 10 to serve as the gate oxide for a subsequently formed MOSFET. A first polysilicon layer is then formed over the FOX region 12 and the silicon dioxide layer 14 using, for example, a low pressure chemical vapor deposition (LPCVD) process. The first polysilicon layer is doped in order to form a conductive gate 16A for the MOSFET structure.

A tungsten silicide layer is formed on the first polysilicon layer to improve interconnection between the gate polysilicon and subsequently formed metal interconnects. Next, a standard photolithography and etching process is performed to form gate structures 16A and word lines 16B. Active regions 20A, 20B are formed, using well-known processes to implant appropriate impurities in those regions and activate the impurities. Sidewall spacers 22 are subsequently formed on the sidewalls of the first polysilicon layer. Thereafter, active regions 24A, 24B (i.e., MOSFET's source and drain) are formed, using well-known processes to implant appropriate impurities in those regions and activate the impurities.

Then a first dielectric layer 26 is deposited on the gate structures 16A, word line 16B and the substrate 10 for isolation. A second dielectric layer 28 is subsequently formed on the first dielectric layer 26. The second dielectric layer 28 can be formed of any suitable material such as, for example, BPSG. Preferably, the second dielectric layer 28 is formed using a conventional chemical vapor deposition process. The second dielectric layer 28 is then planarized to improve the topography for the next processing step.

A silicon nitride layer 30 is formed on the second dielectric layer 28. Then, an oxide layer 32 is formed on the silicon nitride layer 30. A second polysilicon layer 34 is formed on the oxide layer 32. Finally, an oxide layer 36 is then formed on the second polysilicon layer 34. Thus, the sandwich structure of oxide/polysilicon/oxide is used to form a fin capacitor. In this embodiment, the oxide layers 32 and 36 can be formed of any suitable material such as TEOS and silicon dioxide. The oxide layers 32 and 36 and the second polysilicon layer 34 are formed using a conventional chemical vapor deposition process.

FIG. 2 shows the next stage of his method. The oxide layers 32 and 36, the second polysilicon layer 34, the silicon nitride layer 30, the first dielectric layer 26 and the second dielectric layer 28 are patterned and etched to form contact windows over the source/drain regions. Standard processes are used to form and pattern a photoresist layer 38 on the oxide layer 36 to define contact holes over selected source/drain regions 24. The photoresist layer leaves uncovered the contact holes, which are then etched through the oxide layers 32 and 36, the silicon nitride layer 30, the second polysilicon 34, the second dielectric layer 28, and the first dielectric layer 26 to expose a portion of the selected source/drain regions 24A. The resulting structure is shown in FIG. 3.

Turing to FIG. 4, a conformal third polysilicon layer 40 is then formed on the oxide 36 and in the contact hole. The third polysilicon layer 40 is formed using a conventional LPCVD process. Then, the oxide layer 36, the second polysilicon layer 34, and the third polysilicon layer 40 are patterned and etched. Standard processes are used to form and pattern a photoresist layer 42 on the third polysilicon layer 40 to define the pre-fin capacitor node over selected source/drain regions 24A. The oxide layer 36, the second polysilicon 34, and the third polysilicon layer 40 which are uncovered by photoresist layer 42 are etched down to the silicon oxide layer 32.

The structure shown in FIG. 4 is typical of the devices shown in the interior portions of the underlying wafer. However, the structure at the wafer's periphery edge is shown in FIG. 7. There are no contact holes and transistors in this structure. The second dielectric layer 28 is formed on the substrate 10. The silicon nitride layer 30 and the oxide layer 32 are formed on the second dielectric layer 28. The stacked structure, polysilicon layer 34/oxide layer 36/polysilicon layer 40, is formed on the oxide layer 32.

FIG. 5 shows the final stage of the manufacturing process. The oxide layers 36 and 32 are removed by wet etching to form a fin capacitor node. The wet etching process is typically performed by using HF or BOE solution. The wet etching process is controlled in time and typically, this etching step requires a relatively long period of time to remove the oxide layers 32 and 36. The resulting structure after wet etching is shown in FIG. 6.

However, on the wafer's periphery edge shown in FIG. 7, the oxide layers 36 and 32 are also removed by the wet etching process (indicated by the arrows 43). For several reasons known to those in the prior art, there are no contact holes in the stacked structure of polysilicon layer 34/oxide layer 36/polysilicon layer 40, and therefore, when the oxide layers 32 and 36 are removed, the polysilicon layers 34 and 40 will be "peeled" away from the underlying wafer and tend to float towards the interior of the wafer causing substantial product defects.

FIGS. 8–14 schematically illustrate cross-sectional views of the structure formed at various stages in fabricating a cylinder capacitor using conventional process. Referring to FIG. 8, a single crystal substrate 50 with a <100> crystallographic orientation is provided. In this embodiment adapted for DRAM fabrication, MOSFETs, word lines and bit lines are formed in and on the substrate 50 in any suitable manner, such as that described above.

After the MOSFET, word line, and bit line are formed, a second dielectric layer 58 is subsequently formed on a first dielectric layer 56. The second dielectric layer 58 can be formed of any suitable material such as, for example, BPSG. Preferably, the second dielectric layer 58 is formed using a conventional chemical vapor deposition process. The second dielectric layer 58 is then planarized to improve the topography for the next processing step. A silicon nitride layer 60 is formed on the second dielectric layer 58.

Then, the silicon nitride layer 60, the first dielectric layer 56 and the second dielectric layer 58 are patterned and etched to form contact windows over the source/drain regions. Standard processes are used to form and pattern a photoresist layer 61 on the silicon nitride layer 60 to define contact holes over selected source/drain regions 54A. The photoresist layer leaves uncovered the contact holes, which are then etched through the silicon nitride layer 60, the second dielectric layer 58, and the first dielectric layer 56 to expose a portion of the selected source/drain regions 54A. In this embodiment, a standard patterning and etching process is performed to form the contact hole to have the minimum width supported by the photolithography process. The planarization process performed on the second dielectric layer 58 facilitates the formation of the minimum width contact hole. The resulting structure is shown in FIG. 9.

FIG. 10 shows the next stage of the manufacturing process. A second polysilicon layer 64 is then formed on the silicon nitride layer 60 and in the contact hole. The second polysilicon layer 64 is formed using a conventional LPCVD process to completely fill the contact holes. The second polysilicon layer 64 is doped with phosphorus dopants with a concentration of about $10^{20}$–$10^{21}$ ions/cm$^2$ to increase conductivity. Any suitable method may be used to doped the polysilicon such as, for example, in-situ doping. Then, an etching process is performed to remove the second polysilicon layer 64 over on the silicon nitride layer 60. The silicon nitride layer 60 serves as an etching end point.

An oxide layer 66 is formed on the silicon nitride layer 60 and the second polysilicon layer 64. The oxide layer 66 can be any suitable material such as TEOS and silicon oxide. The oxide layer 66 can be formed by conventional chemical vapor deposition process. Then, the oxide layer 66 is patterned and etched to form second contact window over the second polysilicon layer 64 and silicon nitride layer 60. The resulting structure is shown in FIG. 10.

Turning to FIG. 11, a conformal third polysilicon layer 70 is formed on the oxide layer 66 and in the second contact hole. The third polysilicon layer 70 is formed using a conventional LPCVD process. The third polysilicon layer 70 is doped with phosphorus dopants with a concentration of about $10^{20}$–$10^{21}$ ions/cm$^2$ to increase conductivity. Any suitable method may be used to doped the polysilicon such as, for example, in-situ doping. An oxide layer 72 is formed on the third polysilicon layer 70. The oxide layer 72 can be any suitable material such as TEOS and silicon oxide. The oxide layer 72 is formed using a suitable chemical vapor deposition process to completely fill in the second contact holes and over the third polysilicon layer 70.

FIG. 12 shows the next stage of this method. The oxide layer 72 over the third polysilicon layer 70 is removed. An etching process(indicated by the arrows 73) is performed to remove the oxide layer 72 over the third polysilicon layer 70. This etching process can be a reactive ion etching process with a high selectivity ratio. The third polysilicon layer 70 serves as an etching end point. Then, the third polysilicon layer 70 over the oxide layer 66 is removed. An etching process (indicated by the arrows 73A) is performed to remove the third polysilicon layer 70 over the oxide layer 66. The etching process can be a reactive ion etching process with a high selectivity ratio. The oxide layer 66 serves as an etching end point. The resulting structure is shown in FIG. 12.

The structure shown in FIG. 12 is typical of the devices shown in the interior portions of the underlying wafer. However, on the wafer's periphery edge as shown in FIG. 14, for reasons known to those skilled in the art, there are no transistors in this structure and there is no contact between the polysilicon layers 64 and 70. The second dielectric layer 58 is formed on the substrate 50. The silicon nitride layer 60 is formed on the second dielectric layer 58. There is a contact hole through the silicon nitride layer 60 and the second dielectric layer 58 to expose the substrate 50. In the contact hole, similar to the interior wafer area, the polysilicon layer 64 fills in the hole. The oxide layer 66 is formed on the silicon nitride layer 60. Unlike the interior device wafer area, the second contact holes do not open through the oxide layer 66 to expose the polysilicon layer 64 and the portion of the silicon nitride layer 60. Therefore, an isolated pre-cylinder structure formed by the polysilicon layer 70 and the oxide layer 72 is formed in the center of the oxide layer.

Finally, the oxide layers 66 and 72 are removed to form a cylinder capacitor node. The preferred method of wet etching is performed by using HF or BOE solution. The resulting structure is shown in FIG. 13. At the same time, on the wafer's periphery edge shown in FIG. 14, the oxide layers 66 and 72 are also removed by the wet etching process. There is no contact between the polysilicon layers 70 and 64, and thus, when the oxide layers are removed, polysilicon layer 70 will "peel" away from the wafer substrate and result in floating particles that will cause defects in the wafer.

The present invention provides a simple improvement to the above described manufacturing process to prevent the generation of particles from the periphery edge of the wafer.

SUMMARY OF THE INVENTION

A method of reducing particles during the manufacture of fin or cylinder capacitors on a wafer, said wafer having a semiconducting substrate; a plurality of transistors formed on said substrate, and said capacitors formed from capacitor conducting layers and capacitor oxide layers, is disclosed. The method comprises: coating a negative photoresist layer on the wafer prior to removing the oxide layers present in forming the capacitors; exposing said negative photoresist layer on the edge of the wafer; removing said unexposed negative photoresist layer on the center of the wafer to form a ring-shaped negative photoresist layer on the edge of said wafer; removing said oxide layers to form said capacitors; and removing said negative photoresist layer on the edge of said wafer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
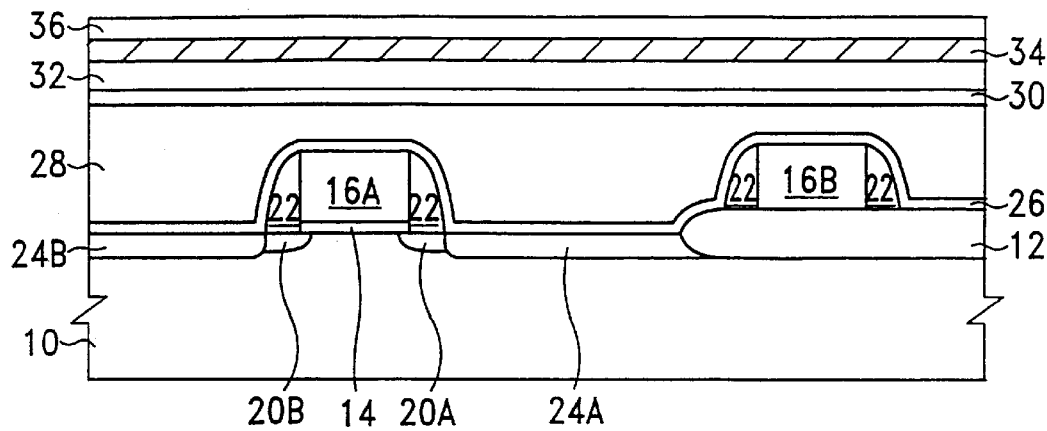
FIGS. 1–7 schematically illustrate cross-sectional views of the structure formed at various stages in fabricating a fin capacitor using conventional processes.
Figure 2:
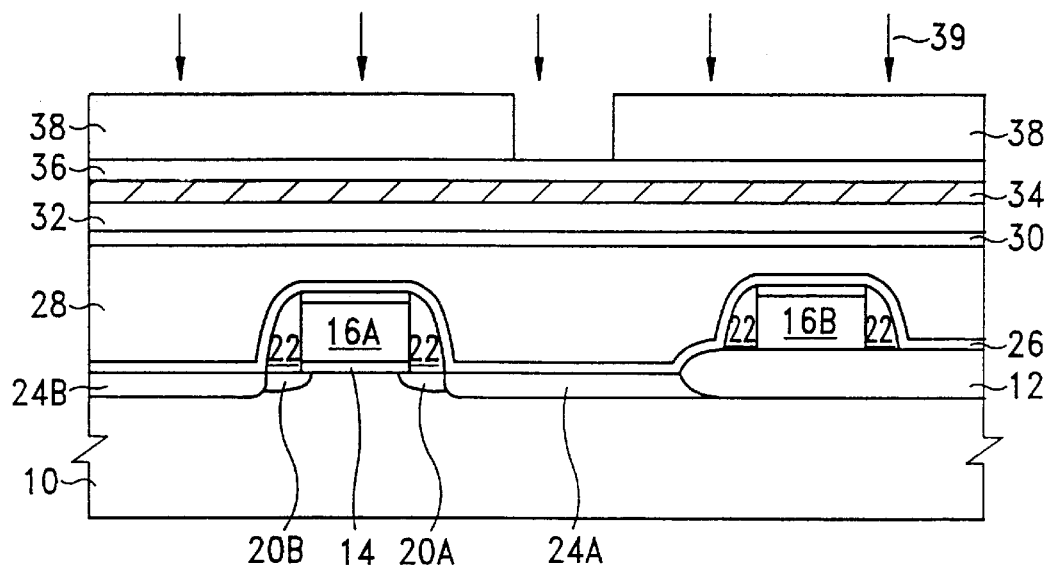
Figure 3:
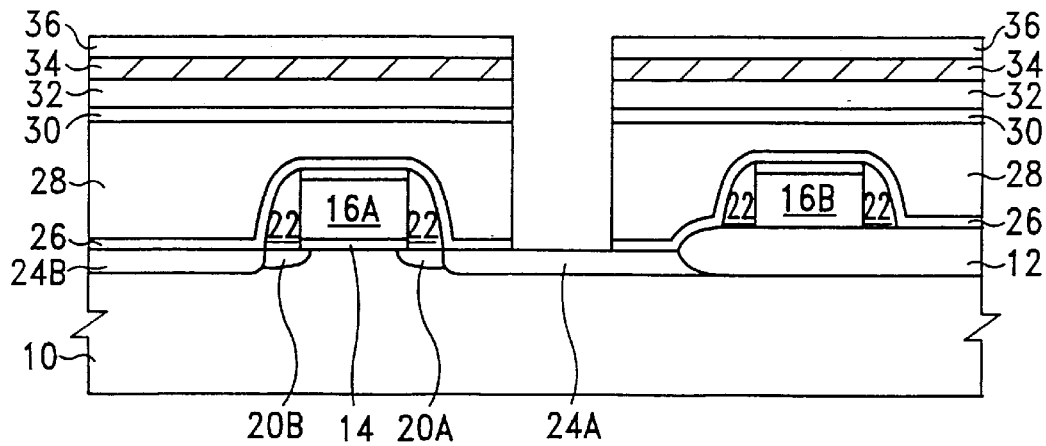
Figure 4:
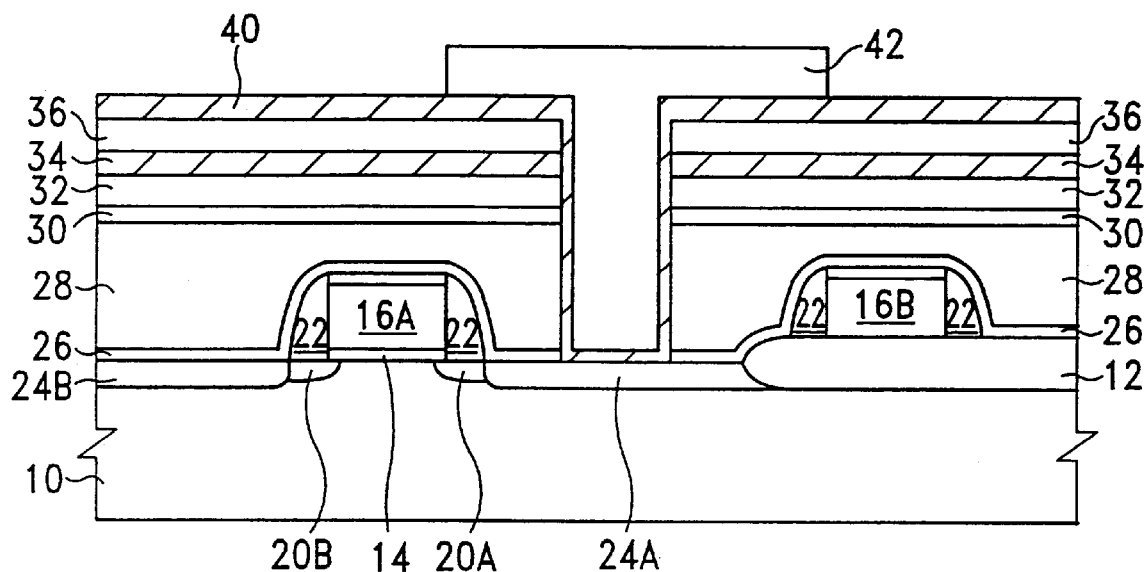
Figure 5:
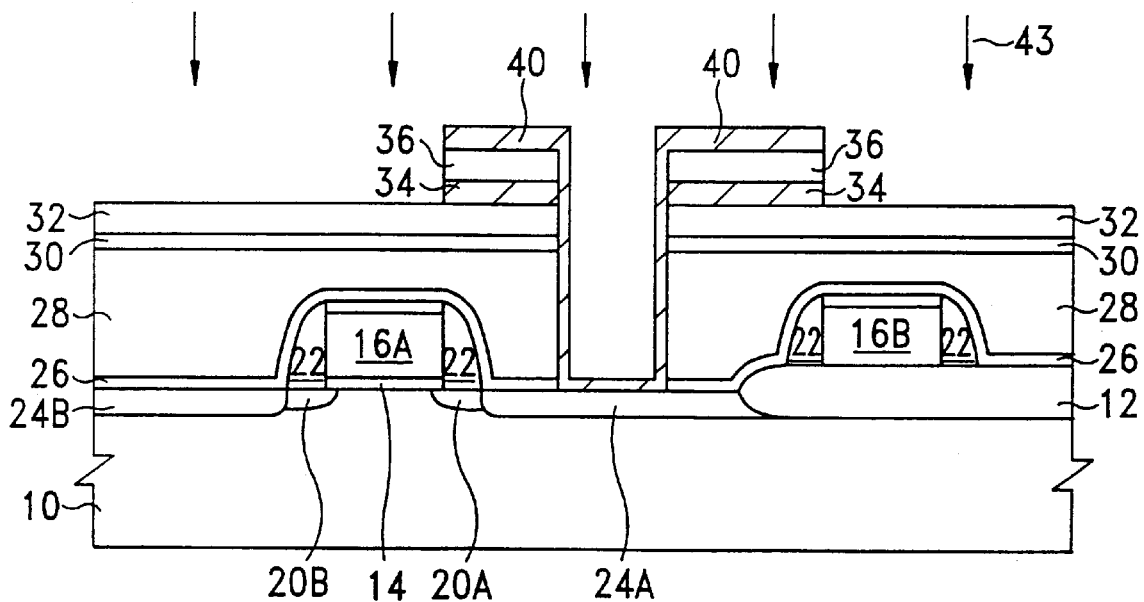
Figure 6:
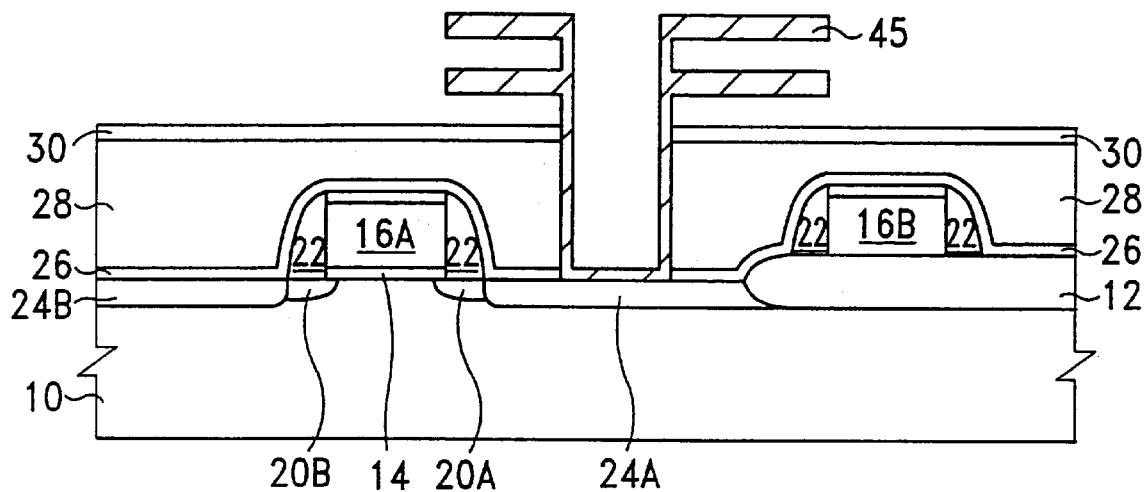
Figure 7:
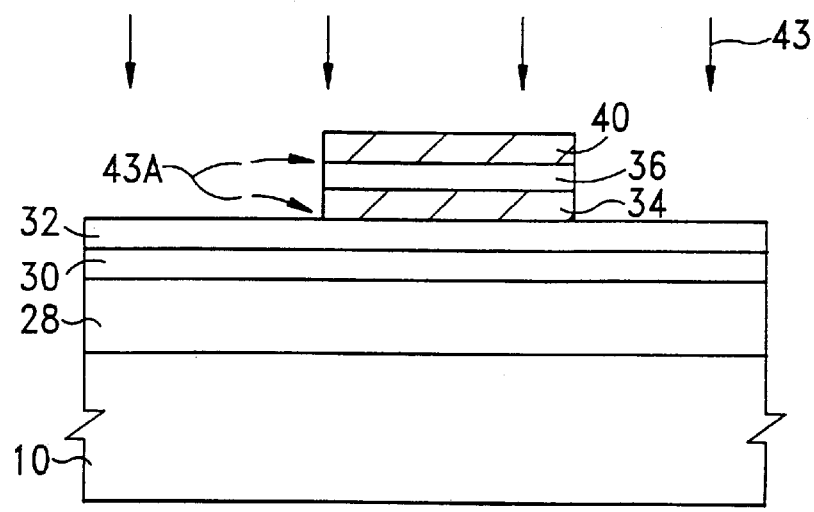
Figure 8:
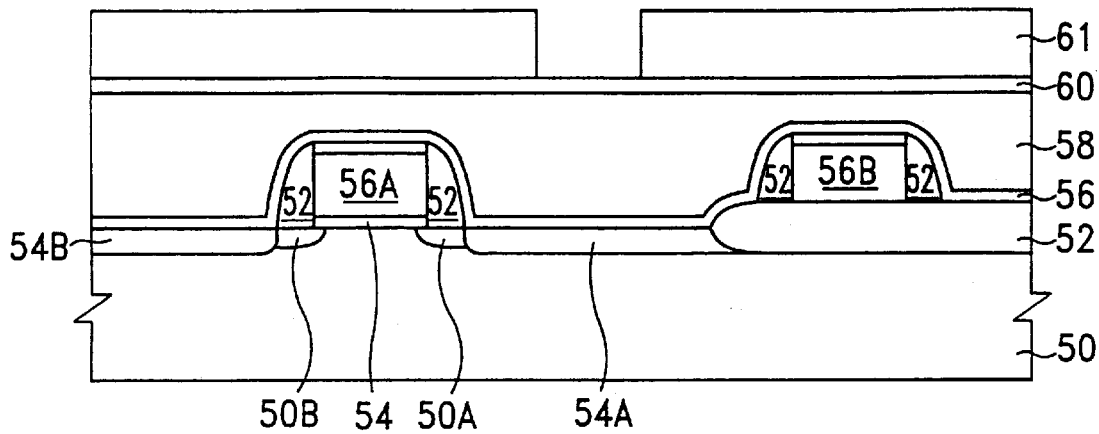
FIGS. 8–14 schematically illustrate cross-sectional views of the structure formed at various stages in fabricating a cylinder capacitor using conventional process.
Figure 9:
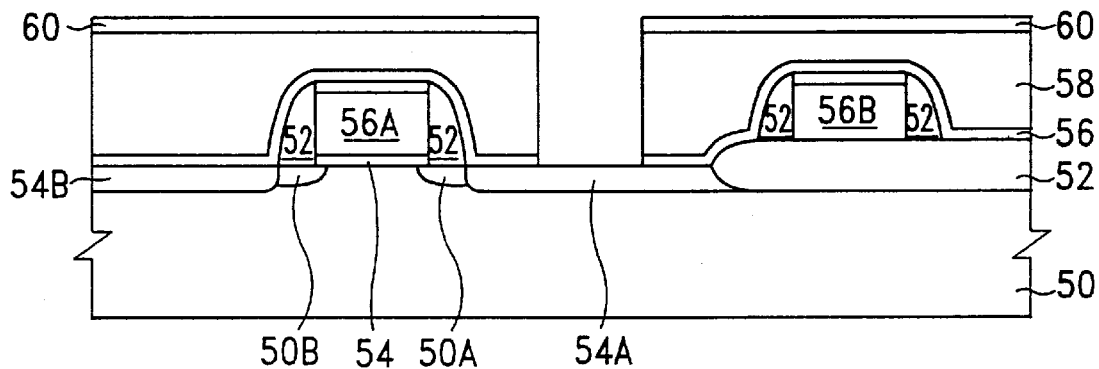
Figure 10:
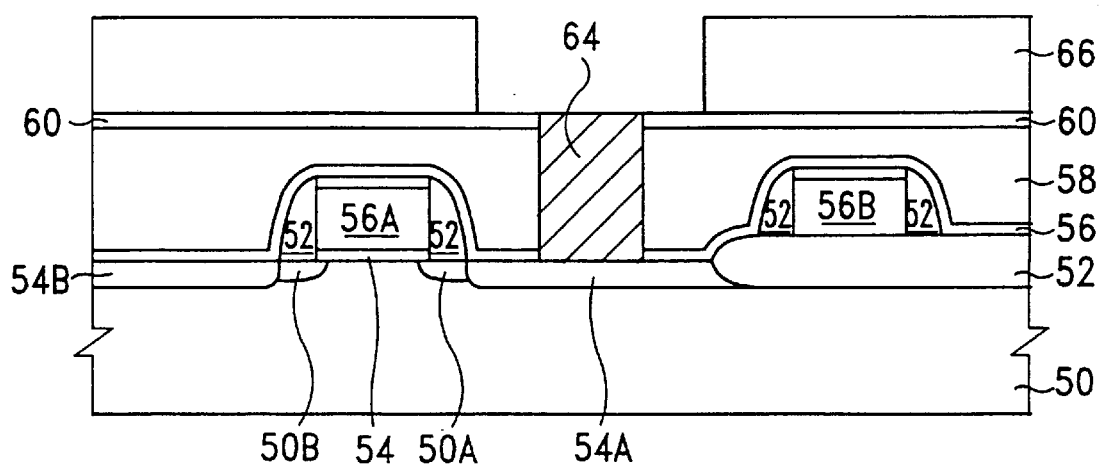
Figure 11:
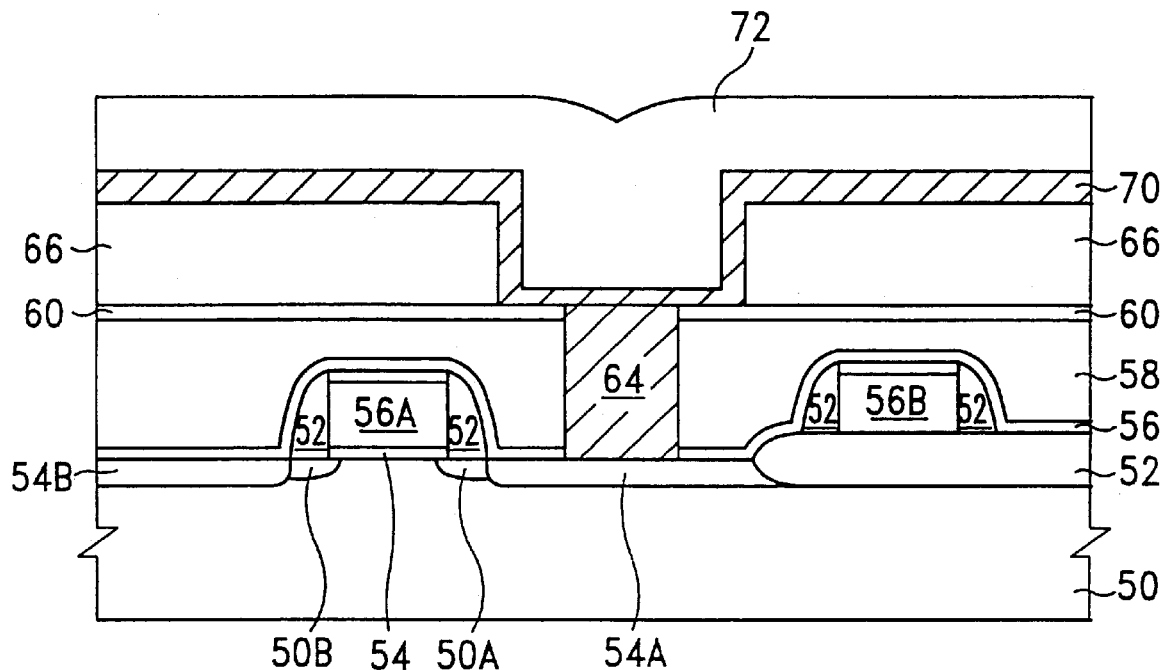
Figure 12:
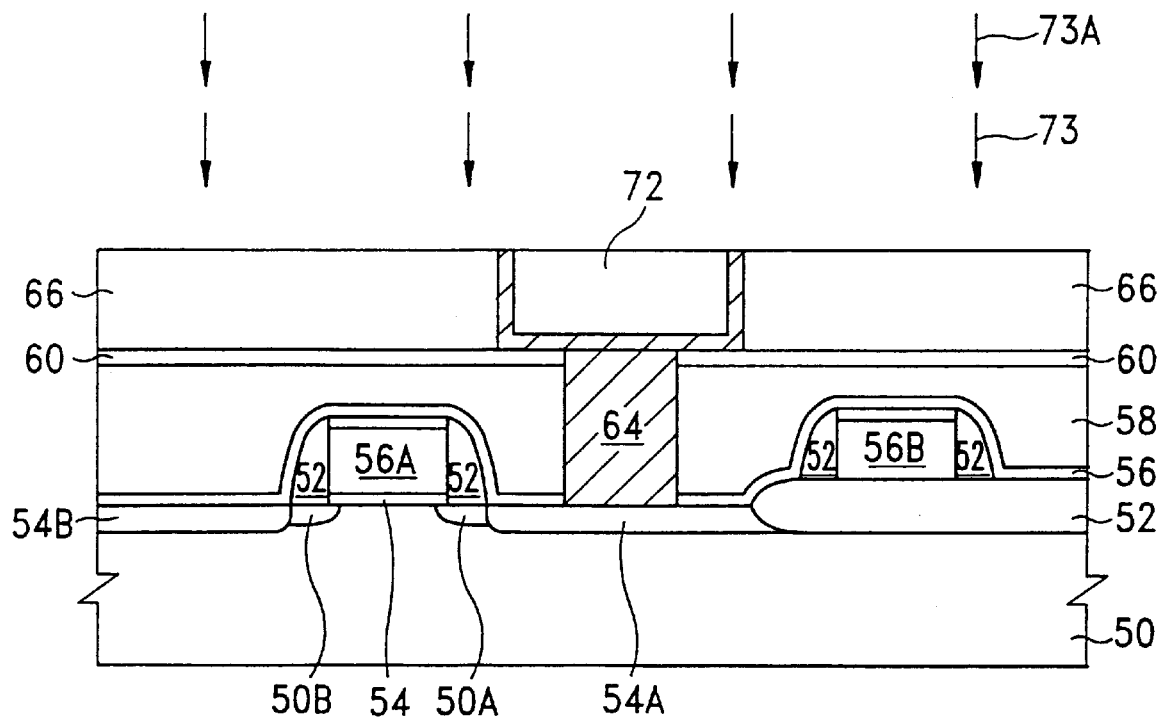
Figure 13:
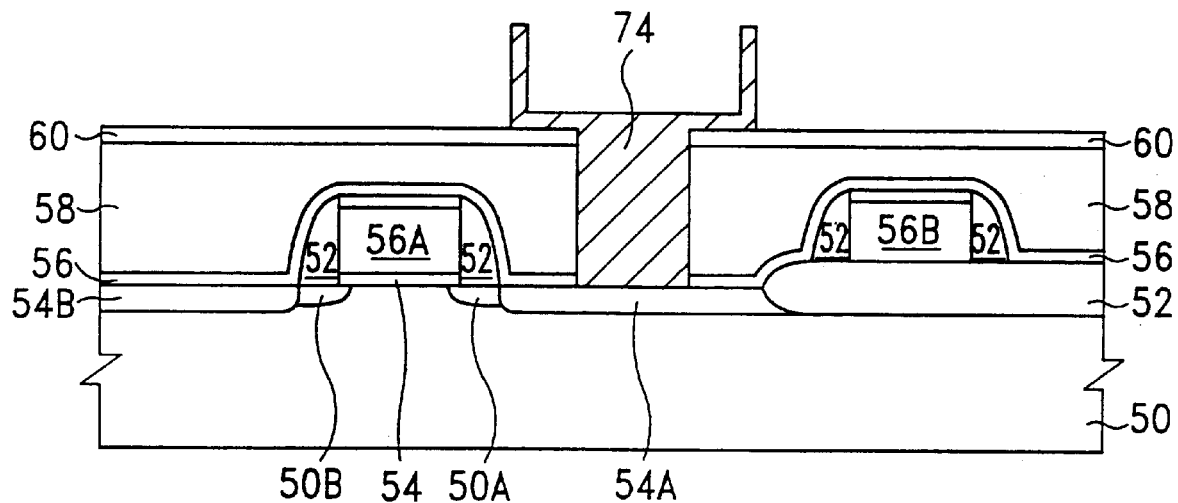
Figure 14:
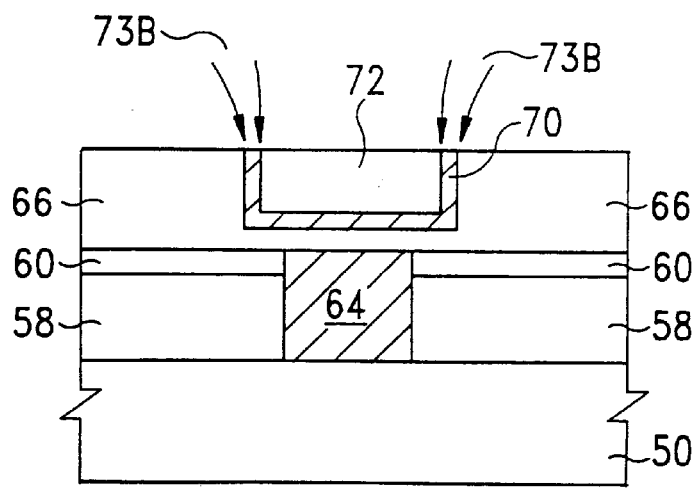
Figure 15:
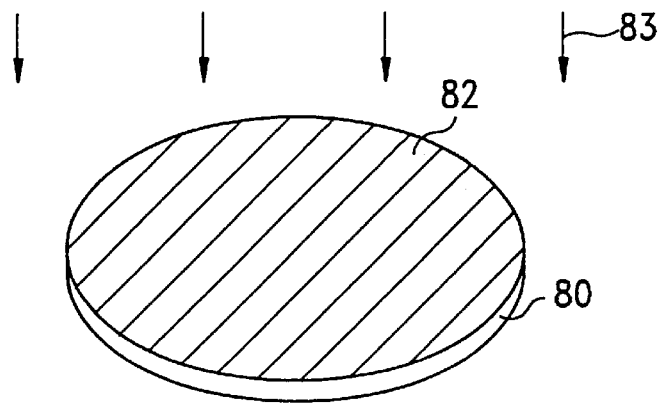
FIGS. 15–16 illustrate side-views of the structure forming a photoresist layer at the edge of a wafer in accordance with one embodiment of the present invention.
Figure 16:
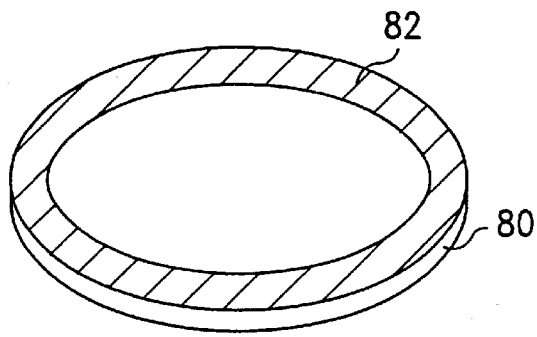

This invention discloses a technique of using a negative photoresist (such as polyimide) to coat on the wafer. Polyimide is coated on the whole wafer 80 as shown in FIG. 15. Next, the periphery edge of the wafer 80 is exposed to the developing UV light. In the preferred embodiment, a 3.0 mm ring 82 around the periphery edge of the wafer is exposed, as indicated by the arrows 83 and seen in FIG. 16 (WEE wafer edge exposure). This procedure is performed before the oxide removal process is executed. It can be appreciated that the width of the ring 82 is dependent upon the structure of the fin or cylinder capacitors on the wafer. It is contemplated that all structures as shown in FIGS. 7 and 14 are included in the exposed ring 82 of polyimide. After the ring 82 is formed, the oxide removal by wet etching may be performed. It has been found that the polyimide ring 82 serves to prevent the oxide underneath the ring from being removed by the etching process, and therefore, the polysilicon fragments at the periphery edge of the wafer are not dislodged. After the wet etching is completed, the polyimide ring 82 can be completely removed by $H_2SO_4/H_2O_2$ mixture solution or acidic solution.

Figure 17:
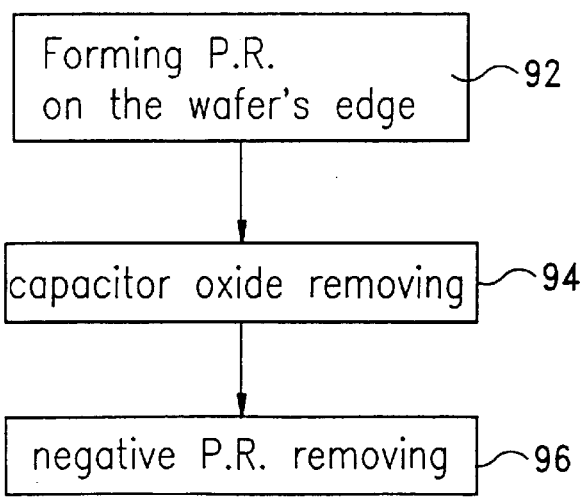
FIG. 17 is a flow chart of the steps in accordance with one embodiment of the present invention.

FIG. 17 shows a flow chart of the steps of this invention. The method of this invention simply includes three steps: coating a ring-shaped negative photoresist layer at block 92 on the edge of the wafer before removing the oxide layers, removing at block 94 the oxide layer present in the capacitor, and removing at block 96 the ring-shaped negative photoresist layer. This novel process provides the complete solution to the defect issues from fin-polysilicon or cylinder-polysilicon peeling.

Figure 18:
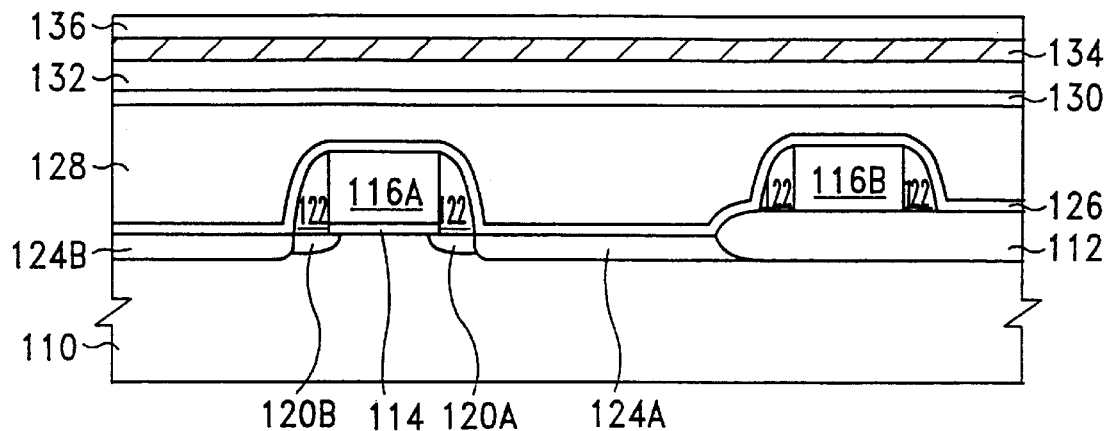
FIGS. 18–27 schematically illustrate cross-sectional views of the structure formed at various stages in fabricating a fin capacitor in accordance with one embodiment of the present invention.

To further illustrate with respect to fin capacitors, FIGS. 18–27 schematically illustrate cross-sectional views of the structure formed at various stages in fabricating fin capacitor node in accordance with one embodiment of the present invention. Referring to FIG. 18, a single crystal substrate 110 with a <100> crystallographic orientation is provided. In this embodiment adapted for DRAM fabrication, MOSFETs, word lines and bit lines are formed in and on the substrate 110 in any suitable manner. In one embodiment, the word lines and bit lines are formed as follows.

A thick field oxide (FOX) region 112 is formed to provide isolation between devices on the substrate 110. Next, a silicon dioxide layer 114 is created on the top of surface of the substrate 110 to serve as the gate oxide for subsequently formed metal oxide silicon field effect transistors. In this embodiment, the silicon dioxide layer is formed by using an oxygen-steam ambient, at a temperature of about 850–1000° C. Alternatively, the oxide layer may be formed using any suitable oxide chemical compositions and procedures. In this embodiment, the silicon dioxide layer is formed to a thickness of approximately 100 angstroms.

A first polysilicon layer is then formed over the FOX region 112 and the silicon dioxide layer 114 using a low pressure chemical vapor deposition (LPCVD) process. The first polysilicon layer is doped in order to form a conductive gate for the MOSFET structure. In this embodiment, the first polysilicon layer has a thickness of about 500–2000 angstroms and is doped with phosphorus dopants at a concentration of about $10^{20}$–$10^{21}$ ions/cm². A tungsten silicide layer is formed on the first polysilicon layer to improve interconnection between the gate polysilicon and subsequently formed metal interconnects. Next, a standard photolithography and etching process is performed to form gate structures 116A and word lines 116B. Active regions 120A, 120B are formed, using well-known processes to implant appropriate impurities in those regions. Sidewall spacers 122 are subsequently formed on the sidewalls of the first polysilicon layer. Thereafter, active regions 124A, 124B are formed, using well-known processes to implant appropriate impurities in those regions and activate the impurities.

Then a first dielectric layer 126 is deposited on the gate structures 116A, word line 116B and the substrate 110 for isolation. A second dielectric layer 128 is subsequently formed on the first dielectric layer 126. The second dielectric layer 128 can be formed of any suitable material such as, for example, BPSG. Preferably, the second dielectric layer 128 is formed using a conventional chemical vapor deposition process. The second dielectric layer 128 is then planarized to improve the topography for the next processing step. A silicon nitride layer 130 is formed on the second dielectric layer 128. Then, An oxide layer 132 is formed on the silicon nitride layer 130. A second polysilicon layer 134 is formed on the oxide layer 132. An oxide layer 136 is then formed on the second polysilicon layer 134. Thus, the sandwich structure of oxide/polysilicon/oxide is formed. In this embodiment, the oxide layers 132 and 136 can be formed of any suitable material such as TEOS and silicon dioxide. The oxide layers 132 and 136 and the second polysilicon layer 134 are formed using a conventional chemical vapor deposition process.

Figure 19:
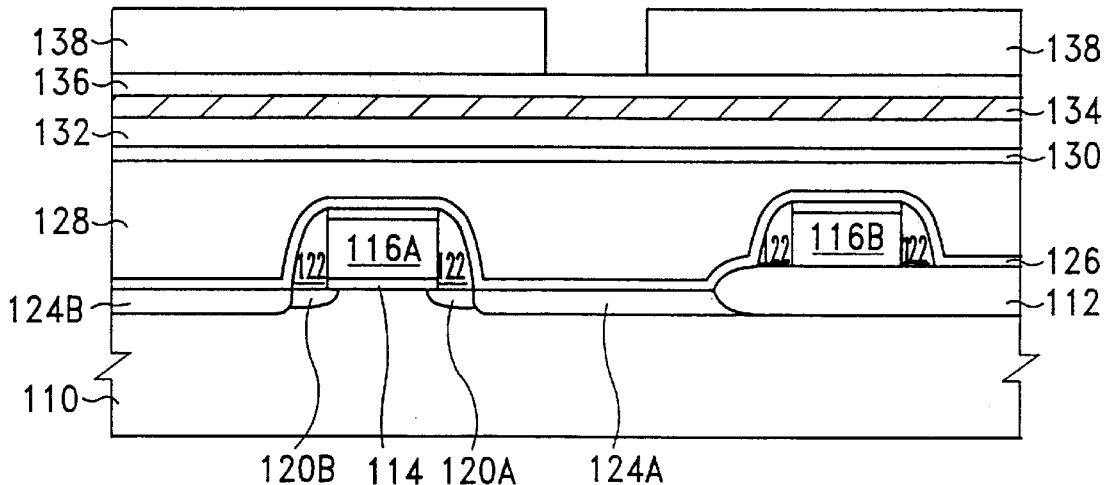
Figure 20:
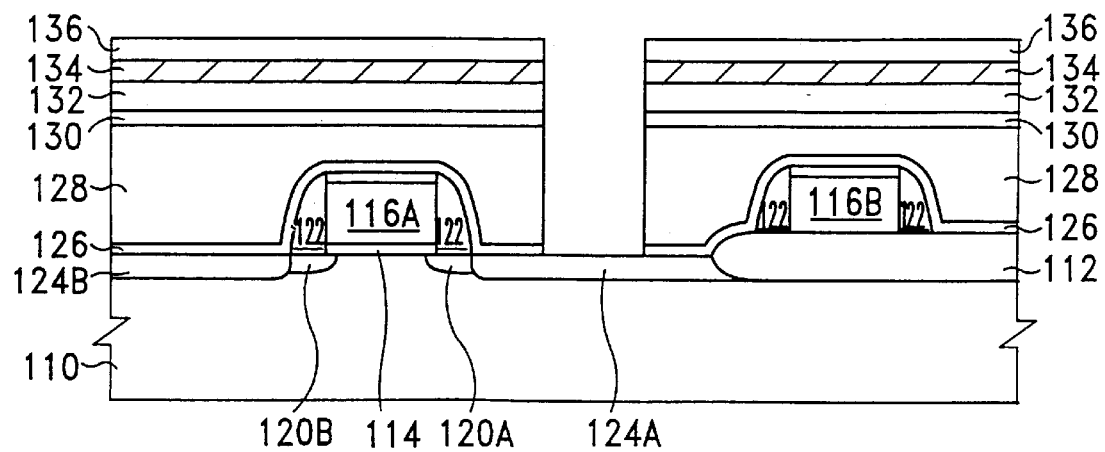

FIG. 19 shows the next stage of this manufacturing method. The oxide layers 132 and 136, the second polysilicon layer 134, the silicon nitride layer 130, the first dielectric layer 126 and the second dielectric layer 128 are patterned and etched to form a contact window. Standard processes are used to form and pattern a photoresist layer 138 on the oxide layer 136 to define contact holes over selected source/drain regions 124A. The photoresist layer leaves uncovered the contact holes, which are then etched through the oxide layers 132 and 136, the silicon nitride layer 130, the second polysilicon layer 134, the second dielectric layer 128, and the first dielectric layer 126 to expose a portion of the selected source/drain regions 124A. The resulting structure is shown in FIG. 20.

Figure 21:
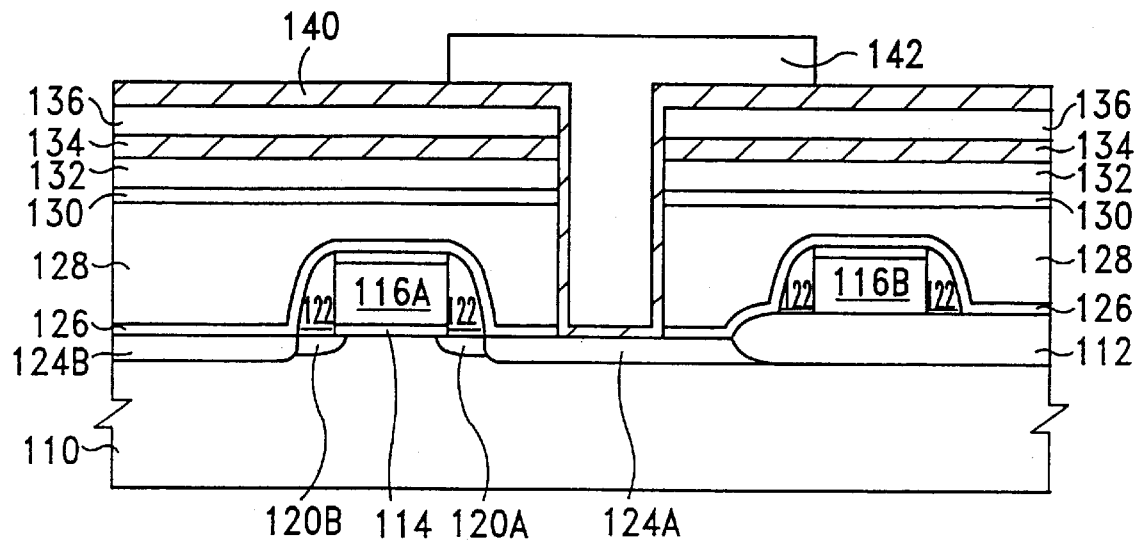
Figure 22:
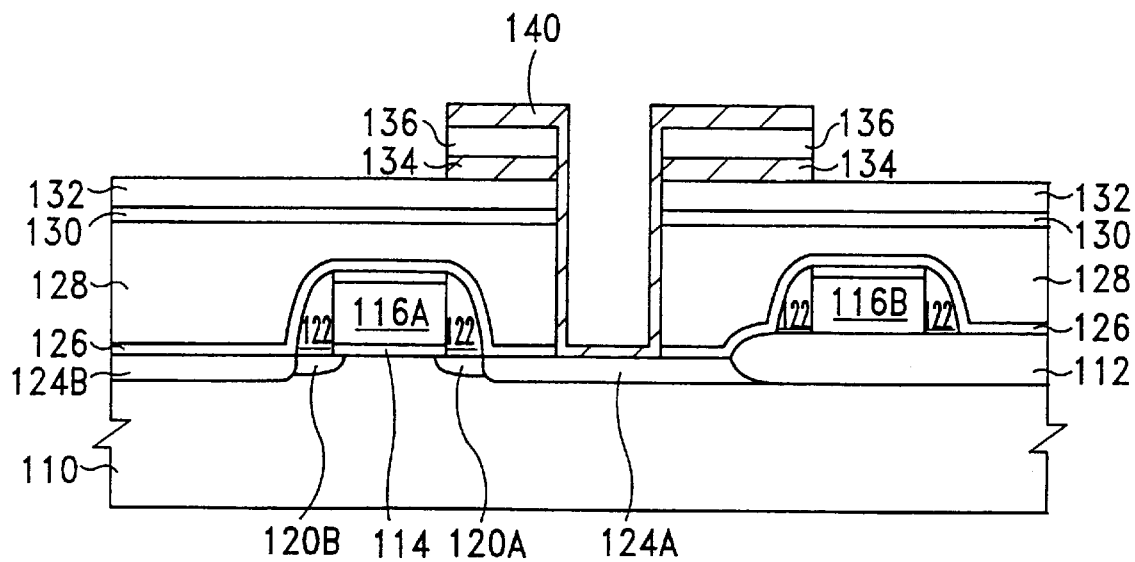

Turning to FIG. 21, a conformal third polysilicon layer 140 is then formed on the oxide 136 and in the contact hole. The third polysilicon layer 140 is formed using a conventional LPCVD process. Then, the oxide layer 136, the second polysilicon layer 134, and the third polysilicon layer 140 are patterned and etched to form a pre-fin capacitor node over the source/drain regions. Standard processes are used to form and pattern a photoresist layer 142 on the third polysilicon layer 140 to define the pre-fin capacitor node over selected source/drain regions 124. The oxide layer 136, the second polysilicon layer 134, and the third polysilicon layer 140 which are uncovered by photoresist layer 142 are etched to expose the oxide layer 132. The resulting structure is shown in FIG. 22.

Figure 23:
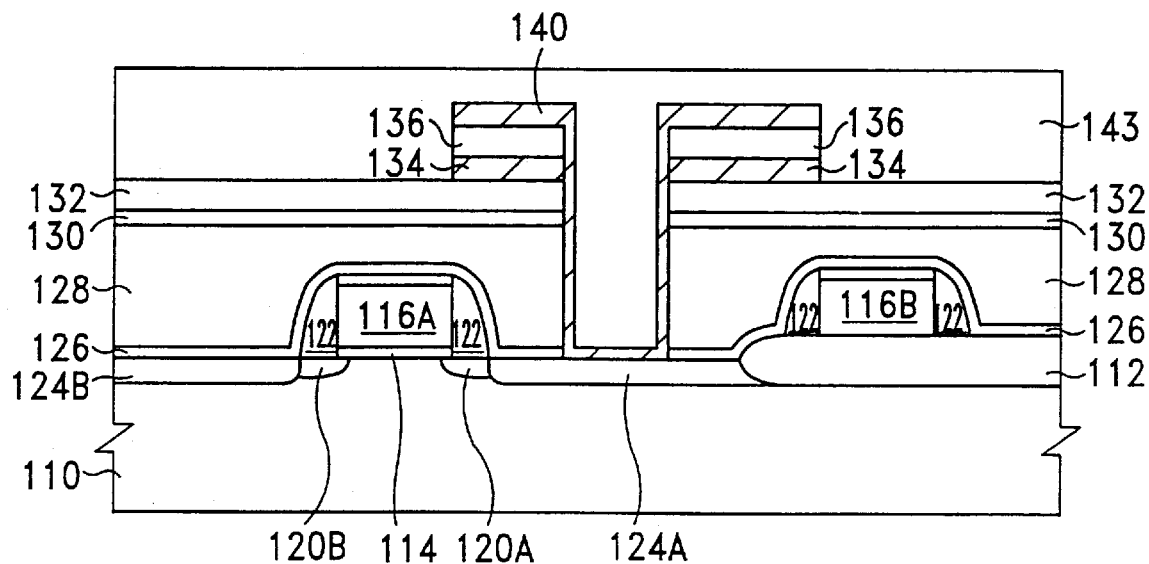
Figure 24:
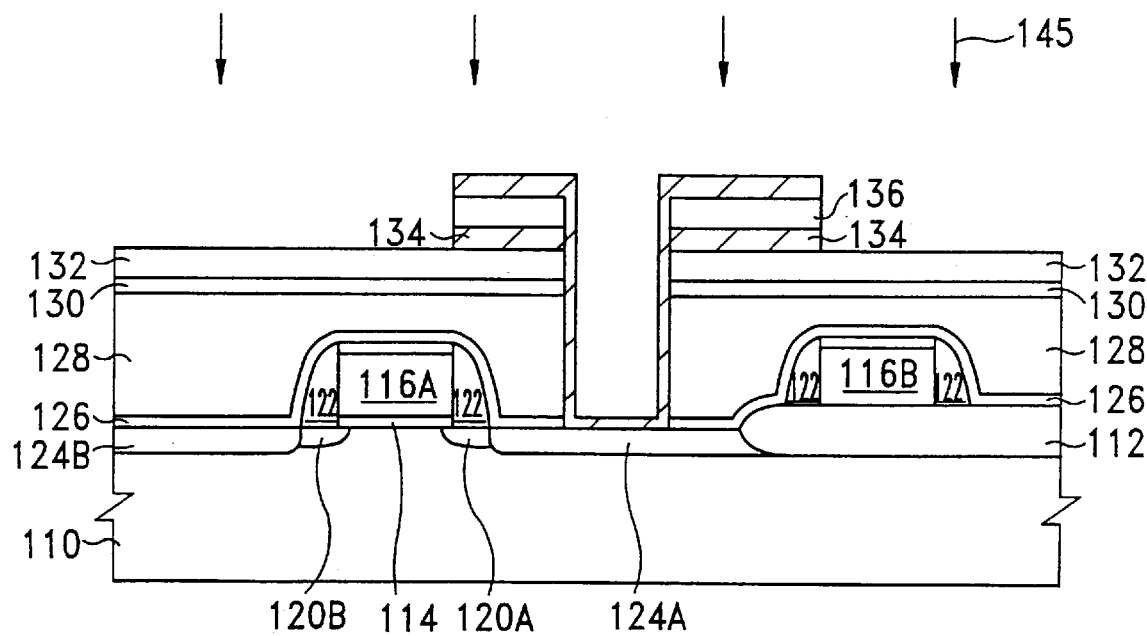
Figure 26:
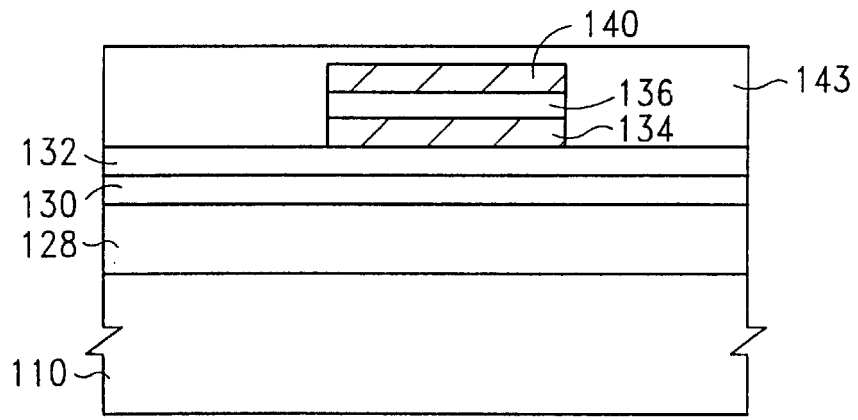

Then, in accordance with the present invention, a negative photoresist layer 143 is coated onto the whole wafer. Thus, in the device area, the negative photoresist layer 143 is formed on the oxide layer 132 and the polysilicon layer 140 as shown in FIG. 23. Next, the negative photoresist layer 143 on the wafer's periphery edge is exposed to make a ring-shaped negative photoresist layer. In one actual embodiment, the photoresist ring is approximately 3.0 mm. Thus, the negative photoresist layer 143 on the interior of the photoresist ring is removed and the resultant structure is shown in FIG. 24. However, the structure of the wafer's periphery edge is shown in FIG. 26. The negative photoresist layer 143 covers the oxide layer 132 and the polysilicon layer 140 to protect the structure during wet etching of the oxide.

Figure 25:
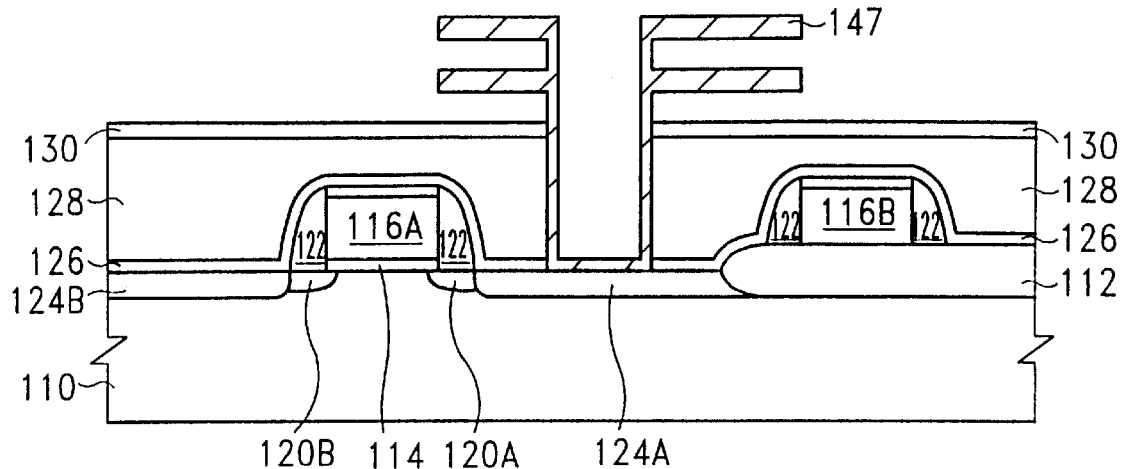
Figure 27:
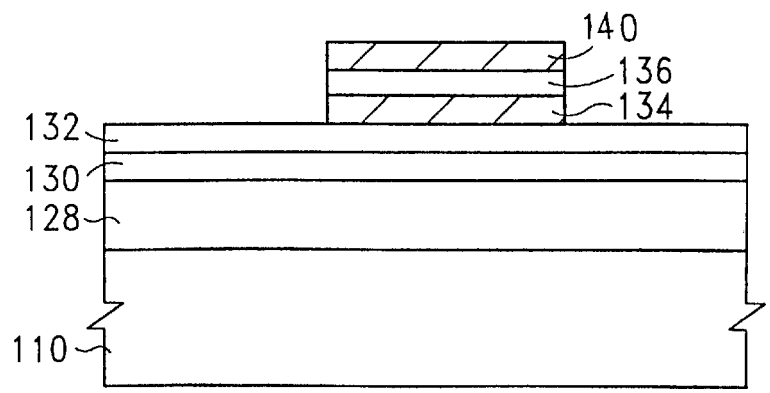

FIG. 25 shows the next stage of this method. The oxide layers 136 and 132 are removed to form a fin capacitor node. A conventional wet etching process is performed to remove the oxide layers 136 and 132. The wet etching process is performed by using HF or BOE solution. After the wet etching a fin shaped capacitor node is formed. However, on the wafer's periphery edge, the oxide layers 136 and 132 is not removed by the wet etching process. The negative photoresist layer 143 on the wafer's periphery edge will prevent the oxide layers 136 and 132 from being removed. After the oxide layers 136 and 132 are removed from the interior of the wafer to form a fin capacitor node, the negative photoresist layer 143 is removed. In this embodiment, a photoresist strip is performed to remove the negative photoresist layer 143. The resulting structure at the periphery edge of the wafer is shown in FIG. 27.

Figure 28:
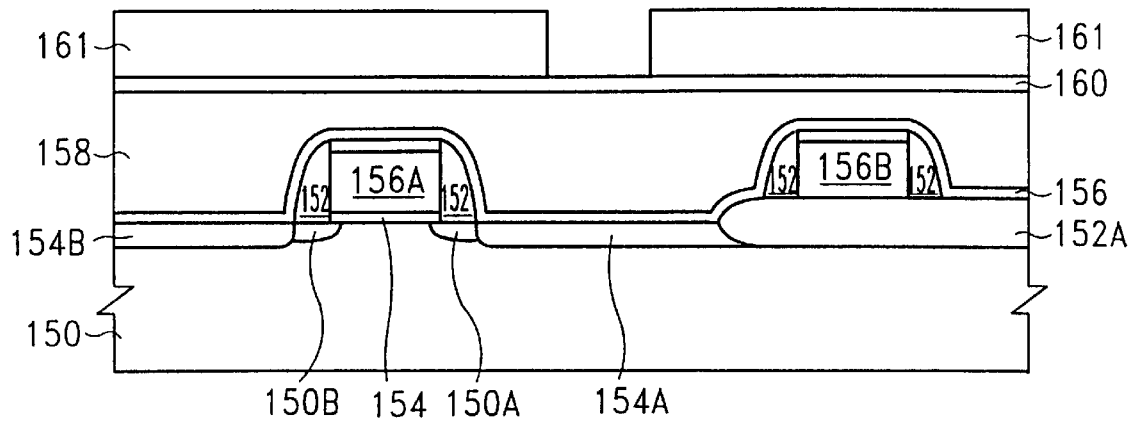
FIGS. 28–36 schematically illustrate cross-sectional views of the structure formed at various stages in fabricating a cylinder capacitor in accordance with another embodiment of the present invention.

To further illustrate with respect to cylinder capacitors, referring to FIG. 28, a single crystal substrate 150 with a <100> crystallographic orientation is provided. In this embodiment adapted for DRAM fabrication, MOSFETs, word lines and bit lines are formed in and on the substrate 150 in any suitable manner. In one embodiment, the word lines and bit lines are formed as follows.

A thick field oxide (FOX) region 152A is formed to provide isolation between devices on the substrate 10. The FOX region 152A is created in a conventional manner. Next, a silicon dioxide layer 154 is created on the top of surface of the substrate 150 to serve as the gate oxide for a subsequently formed MOSFET. In this embodiment, the silicon dioxide layer is formed by using an oxygen-steam ambient, at a temperature of about 850–1000° C. Alternatively, the oxide layer may be formed using any suitable oxide chemical compositions and procedures. In this embodiment, the silicon dioxide layer is formed to a thickness of approximately 100 angstroms.

A first polysilicon layer is then formed over the FOX region 152A and the silicon dioxide layer 154 using a low pressure chemical vapor deposition (LPCVD) process. The first polysilicon layer is doped in order to form a conductive gate for the MOSFET structure. In this embodiment, the first polysilicon layer has a thickness of about 500–2000 angstroms and is doped with phosphorus dopants at a concentration of about $10^{20}$–$10^{21}$ ions/cm$^2$. A tungsten silicide layer is formed on the first polysilicon layer to improve interconnection between the gate polysilicon and subsequently formed metal interconnects. Next, a standard photolithography and etching process is performed to form gate structures 156A and word lines 156B. Active regions 150A and 150B are formed, using well-known processes to implant appropriate impurities in those regions. Sidewall spacers 152 are subsequently formed on the sidewalls of the first polysilicon layer. Thereafter, active regions 154A and 154B are formed, using well-known processes to implant appropriate impurities in those regions.

Next, a first dielectric layer 156 is deposited on the gate structures 156A, word line 156B and the substrate 150 for isolation. The first dielectric layer 156, in the preferred embodiment, is composed of an undoped oxide formed using a standard chemical vapor deposition process to a thickness of about 1000–2000 angstroms.

A second dielectric layer 158 is subsequently formed on the first dielectric layer 156. The second dielectric layer 158 can be formed of any suitable material such as, for example, BPSG. Preferably, the second dielectric layer 158 is formed using a conventional chemical vapor deposition process. The thickness of the second dielectric layer 158 is about 5000 angstroms, but can be any suitable thickness in the range of 3000 to 8000 angstroms. The second dielectric layer 158 is then planarized to improve the topography for the next processing step.

Figure 29:
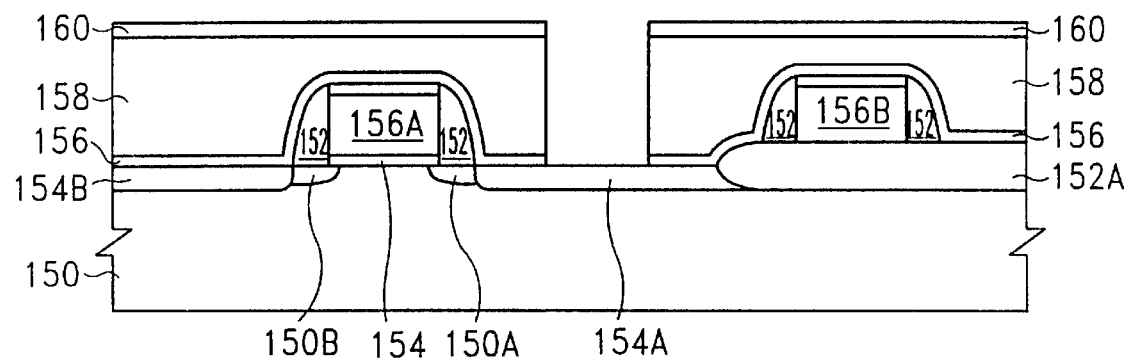

Next, a silicon nitride layer 160 is formed on the second dielectric layer 158. Then, the silicon nitride layer 160, the first dielectric layer 156 and the second dielectric layer 158 are patterned and etched to form contact windows over the source/drain regions. In this embodiment, a standard patterning and etching process is performed to form the contact hole to have the minimum width supported by the photolithography process. The planarization process performed on the second dielectric layer 158 facilitates the formation of the minimum width contact hole. The resulting structure is shown in FIG. 29.

Figure 30:
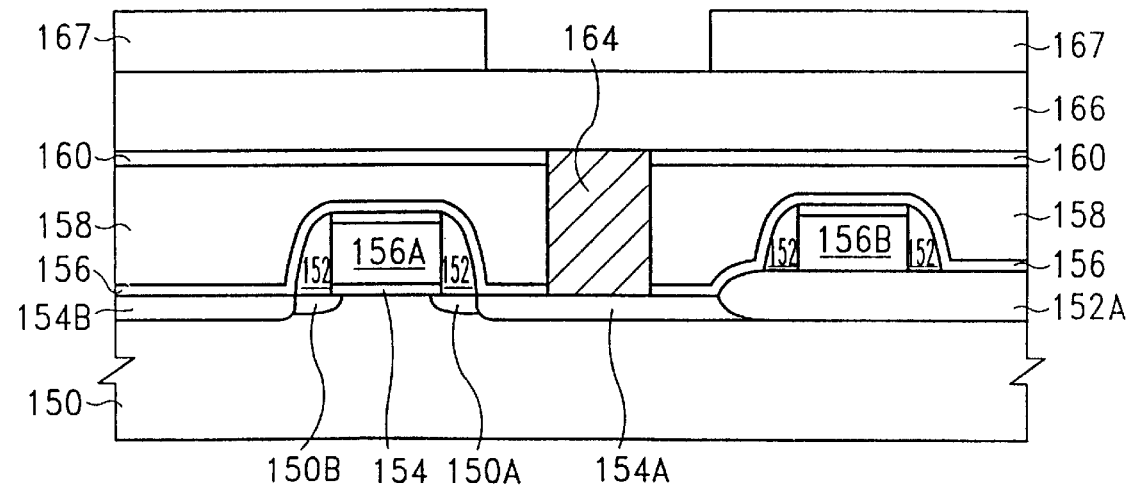

FIG. 30 shows the next stage of this method. A second polysilicon layer 164 is then formed on the silicon nitride layer 160 and in the contact hole. The second polysilicon layer 164 is formed using a conventional LPCVD process to completely fill the contact holes. The second polysilicon layer 164 is doped with phosphorus dopants with a concentration of about $10^{20}$–$10^{21}$ ions/cm$^2$ to increase conductivity. Any suitable method may be used to doped the polysilicon such as, for example, in-situ doping. Then, an etching process is performed to remove the second polysilicon layer 164 on the silicon nitride layer 160. The silicon nitride layer 160 serves as an etching end point. An oxide layer 166 is formed on the silicon nitride layer 160 and the second polysilicon layer 164. The oxide layer 166 can be any suitable material such as TEOS and silicon oxide. The oxide layer 166 can be formed by conventional chemical vapor deposition process. Then, the oxide layer 166 is patterned and etched to form second contact windows over the second polysilicon layer 164 and silicon nitride layer 160. Standard processes are then used to form and pattern a photoresist layer 167 on the oxide layer 166 to define second contact holes over the second polysilicon layer 164 and silicon nitride layer 160. The photoresist layer leaves uncovered the second contact holes, which are then etched through the oxide layer 166 to expose a portion of the second polysilicon layer 164 and the silicon nitride layer 160.

Figure 31:
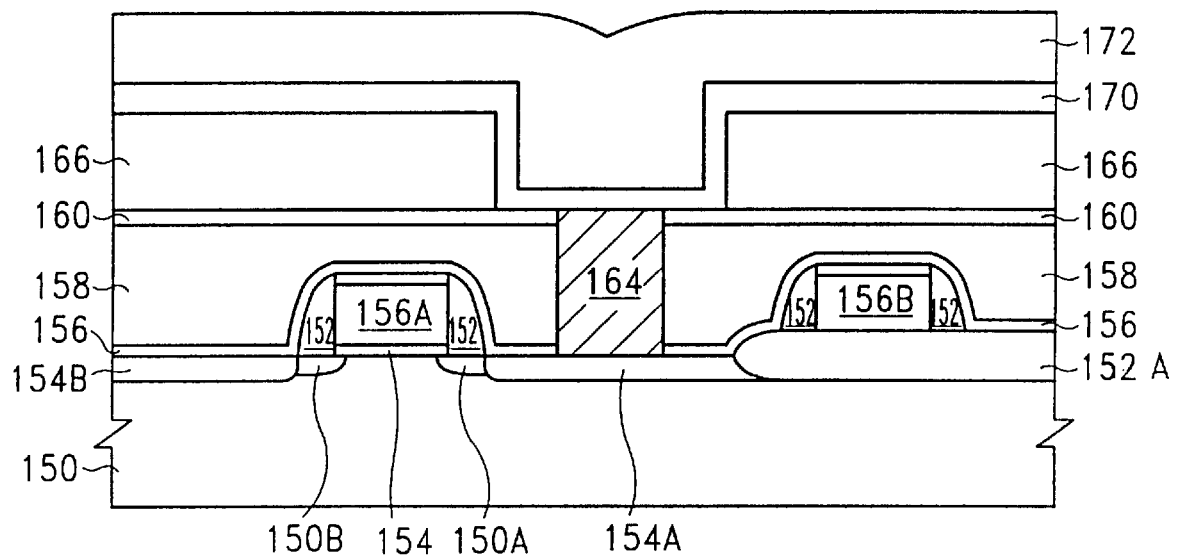

Turning to FIG. 31, a conformal third polysilicon layer 170 is formed on the oxide layer 166 and in the second contact hole. The third polysilicon layer 170 is formed using a conventional LPCVD process. The third polysilicon layer 170 is doped with phosphorus dopants with a concentration of about $10^{20}$–$10^{21}$ ions/cm$^2$ to increase conductivity. An oxide layer 172 is formed on the third polysilicon layer 170. The oxide layer 172 can be any suitable material such as TEOS and silicon oxide and is formed using a suitable chemical vapor deposition process to completely fill in the third contact holes and over the third polysilicon layer 170.

Figure 32:
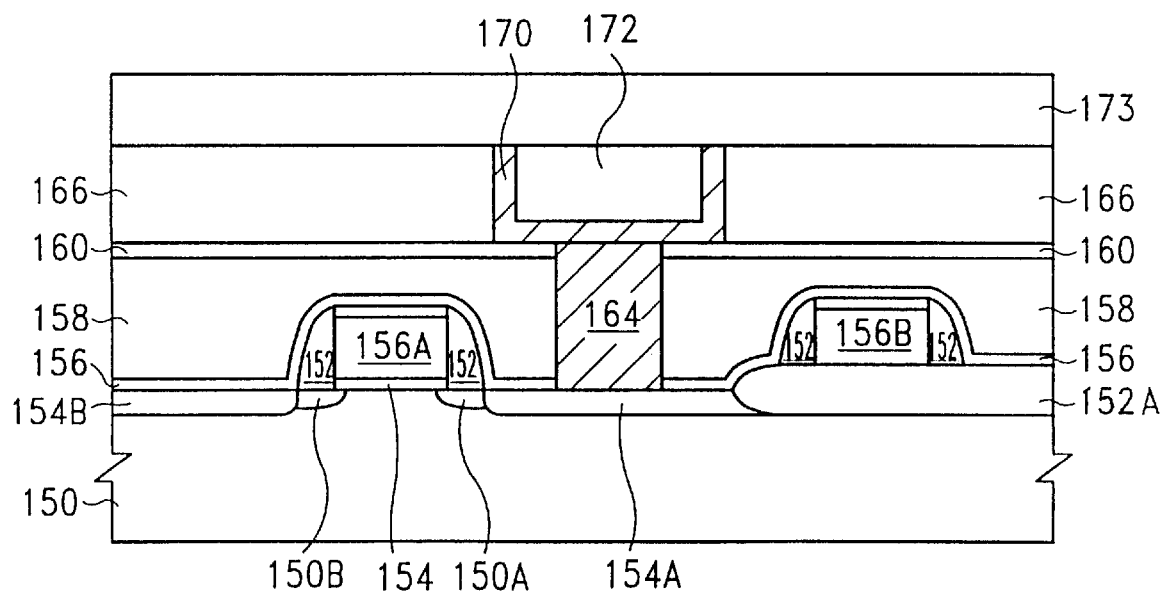

FIG. 32 shows the next stage of this method. The oxide layer 172 over the third polysilicon layer 170 is removed. An etching process is performed to remove the oxide layer 172 over the third polysilicon layer 170. This etching process can be a reactive ion etching process with a high selectivity ratio. The third polysilicon layer 170 serves as an etching end point. Then, the third polysilicon layer 170 over the oxide layer 166 is removed. An etching process is performed to remove the third polysilicon layer 170 over the oxide layer. The etching process can be a reactive ion etching process with a high selectivity ratio. The oxide layer 166 serves as an etching end point.

Figure 33:
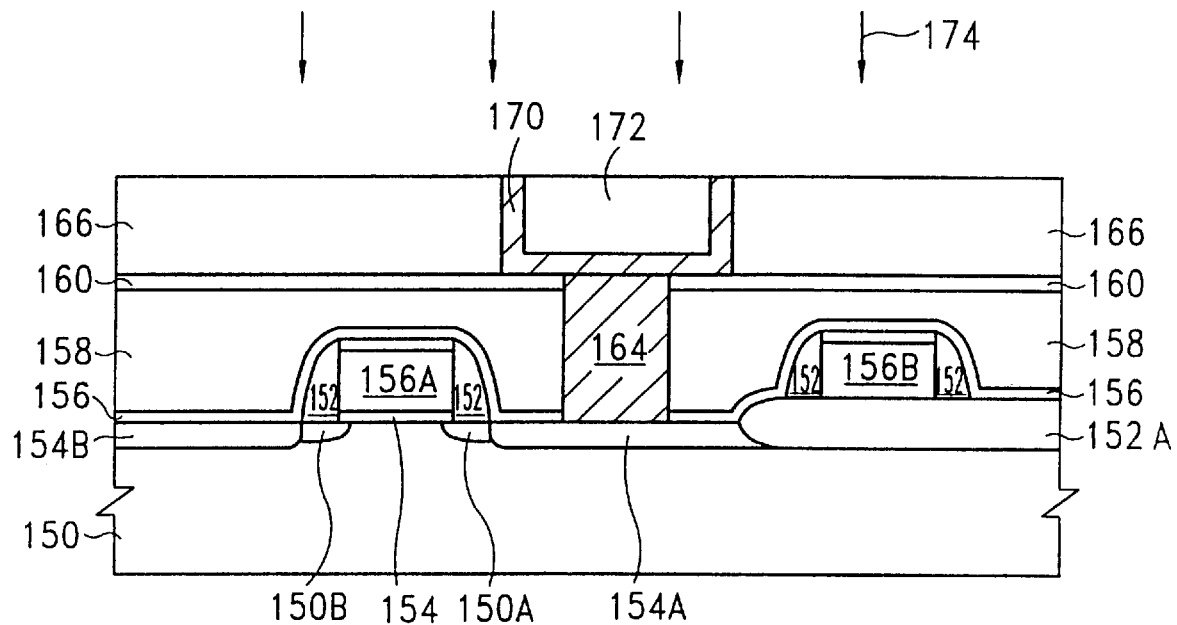
Figure 35:
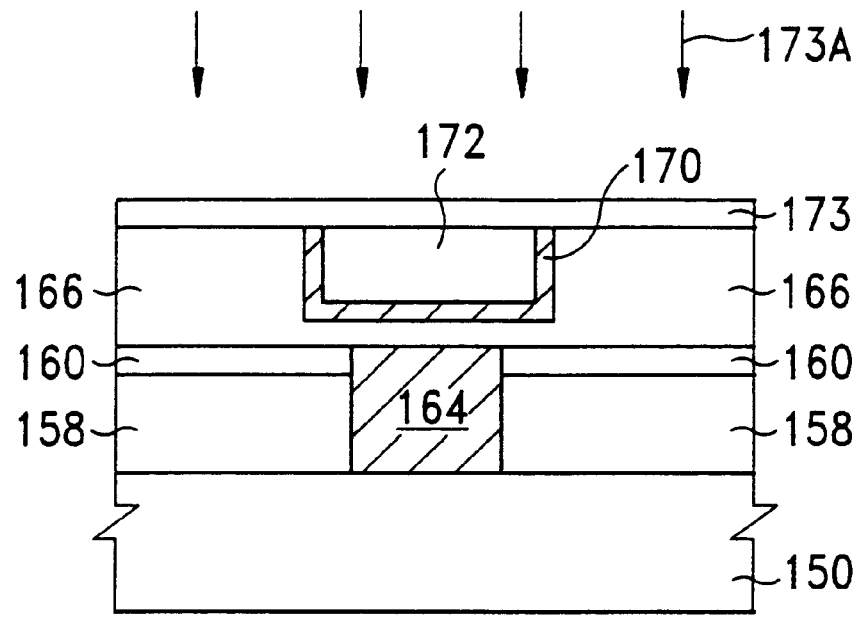

Then, in accordance with the present invention, a negative photoresist layer 173 is coated onto the whole wafer. Thus, in the interior device area, the negative photoresist layer 173 is formed on the oxide layer 166 and the polysilicon layer 170 as shown in FIG. 32. Next, the negative photoresist layer 173 on the wafer's periphery edge is exposed to make a ring-shaped negative photoresist layer. In one actual embodiment, the photoresist ring is approximately 3.0 mm. Thus, the negative photoresist layer 173 on the interior of the photoresist ring is removed and the resultant structure is shown in FIG. 33. However, the structure of the wafer's periphery edge is shown in FIG. 35. The negative photoresist layer 173 covers the oxide layers 166 and the polysilicon layer 170 to protect the structure during wet etching of the oxide.

Figure 34:
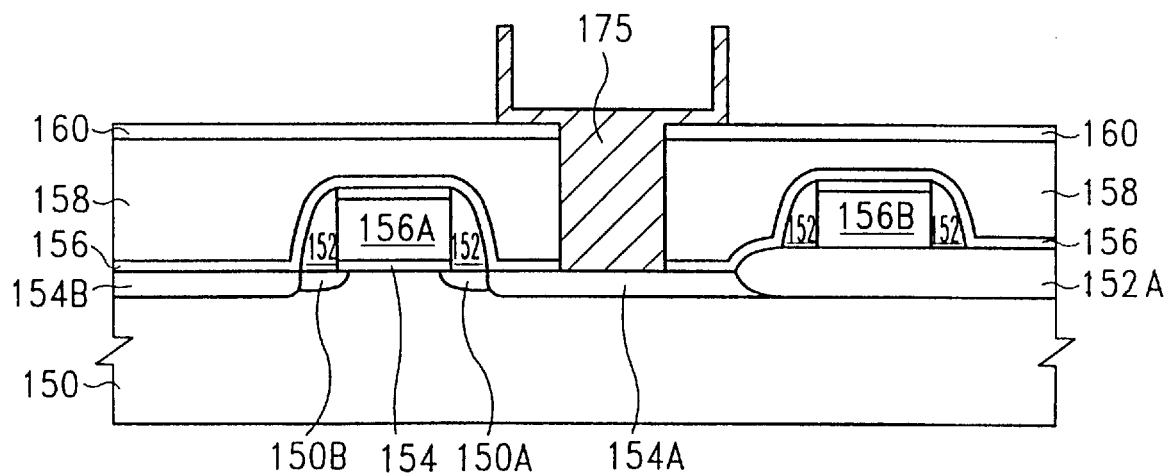
Figure 36:
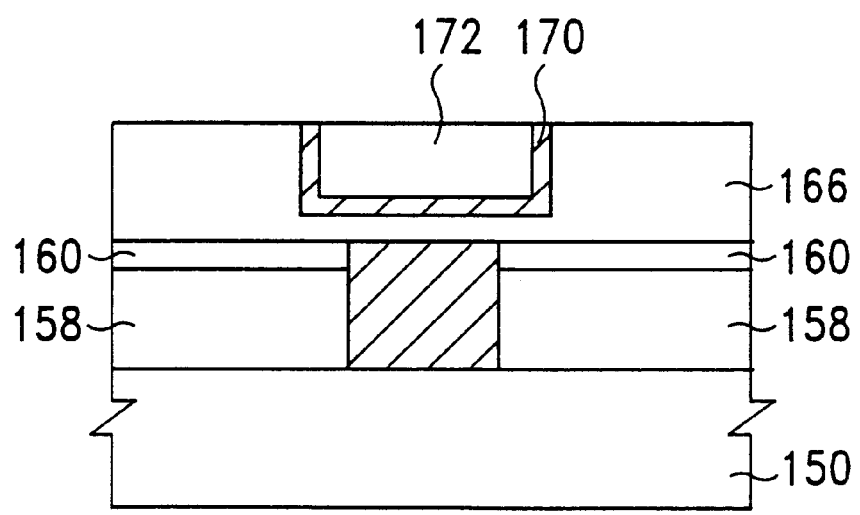

Finally, the oxide layers 166 and 172 are removed to form a cylinder capacitor node. An wet etching process (indicating by the arrows 174) is performed to remove oxide layers 166 and 172. The wet etching process is performed by using HF or BOE solution. The resulting structure is shown in FIG. 34. However, on the wafer's edge, the oxide layers 166 and 172 are not removed by the wet etching process, because when wet dip process is performed, the negative photoresist layer 173 on the wafer's edge will protect the oxide layers 172 and 166. Thus, the polysilicon fragments are not peeled from the wafer. After the oxide layers are removed to form a cylinder capacitor node, the negative photoresist layer 173 is removed. In this embodiment, an photoresist strip is performed to remove the negative photoresist layer 173. The resulting structure is shown in FIG. 36.

Although specific embodiment has been illustrated and described, it will be obvious to those skilled in the art that various modifications may be made without departing from the invention which is intended to be limited solely by the appended claims. For example, although negative photoresist is used in the preferred embodiment, a positive photoresist may also be used. Those of ordinary skill in the art will recognize that the primary focus of the present invention is to prevent the oxide layers at the periphery edge of the wafer from being removed and thereby allow the peeling of polysilicon fragments. Indeed, it may be contemplated to use some other material to protect the oxide layers in the periphery edge of the wafer from being etched away during the wet etching of the oxide layers in the interior of the wafer.

The embodiments of the invention in which an exclusive property or privilege is claimed are defined as follows:

1. A method of reducing defects during the manufacture of fin or cylinder capacitors on a wafer, said wafer having a semiconducting substrate and a plurality of transistors formed on said substrate, wherein a conducting layer, a first dielectric layer, and a second dielectric layer are formed on said wafer, said method comprising:

forming a photoresist layer on an edge of said wafer prior to removing the second dielectric layer, wherein said conducting layer is covered by said second dielectric layer, and said first dielectric layer is under said conducting layer and said second dielectric layer, a first portion of said second dielectric layer at the edge of said wafer being covered by said photoresist layer, said conducting layer being electrically separated from and adherent to said substrate by said first dielectric layer at the edge of said wafer;

removing a second portion of said second dielectric layer at the center of said wafer to expose a portion of said conducting layer originally covered by the second portion of said second dielectric layer at said center of said wafer, said exposed portion of said conducting layer forming bottom storage electrodes of said capacitors; and removing said photoresist layer on the edge of said wafer, said first dielectric layer and said conducting layer being adherent to said wafer after said second portion of said second dielectric layer being removed.

2. The method according to claim 1, wherein said photoresist layer comprises a negative photoresist layer.

3. The method according to claim 1, wherein forming said photoresist layer on the edge of said wafer comprises:

coating a negative photoresist layer on the whole wafer;

exposing said negative photoresist layer on the edge of the wafer, leaving the negative photoresist layer on the center of the wafer to be unexposed; and removing said unexposed negative photoresist layer on the center of the wafer to form a ring-shaped negative photoresist layer.

4. The method according to claim 3, wherein said edge of said wafer comprises a circle having about a 3 mm width.

5. The method according to claim 1, wherein removing said second dielectric layer is done by using a wet etching process.

6. The method according to claim 1, wherein said second dielectric layer is oxide layer.

7. A method of reducing defects during the manufacture of fin or cylinder capacitors on a wafer, said wafer having a semiconducting substrate; a plurality of transistors formed on said substrate, wherein a conducting layer, a first oxide layer, and a second oxide layer are formed on said wafer, said method comprising:

coating a negative photoresist layer on the wafer prior to removing the second oxide layer, wherein said conducting layer is covered by said second oxide layer, and said first oxide layer is under said conducting layer and said second oxide layer, a first portion of said second oxide layer at an edge of said wafer being covered by said negative photoresist layer, said conducting layer being electrically separated from and adherent to said substrate by said first oxide layer at the edge of said wafer;

exposing said negative photoresist layer on the edge of said wafer;

removing said unexposed negative photoresist layer on the center of said wafer to form a ring-shaped negative photoresist layer on the edge of said wafer;

removing a second portion of said second oxide layer located at said center of said wafer to expose a portion of said conducting layer at said center of said wafer, said exposed portion of said conducting layer forming bottom storage electrodes of said capacitors; and removing said negative photoresist layer on the edge of said wafer, said first oxide layer and said conducting layer being adherent to said wafer after said second portion of said second oxide layer is removed.

8. A method of reducing defects during the manufacture of fin or cylinder capacitors on a wafer, wherein a conducting layer and a dielectric layer are formed on said wafer, said conducting layer being patterned to serve as bottom storage electrodes of said capacitors, said method comprising:

forming a protective layer on an edge of said wafer prior to removing the dielectric layer, said protective layer being a positive photoresist;

removing a portion of said dielectric layer not covered by said protective layer to expose a portion of said conducting layer, said exposed portion of said conducting layer forming parts of bottom storage electrodes of said capacitors; and removing said protective layer on the edge of said wafer.

* * * * *